United States Patent
Ban et al.

(10) Patent No.: US 10,818,817 B2
(45) Date of Patent: Oct. 27, 2020

(54) CASCADE-TYPE HYBRID ENERGY CELL

(71) Applicants: Dayan Ban, Waterloo (CA); Guocheng Liu, Waterloo (CA)

(72) Inventors: Dayan Ban, Waterloo (CA); Guocheng Liu, Waterloo (CA)

(73) Assignee: SHIMCO NORTH AMERICA INC., Ontario (CA)

( * ) Notice: Subject to any disclaimer, the term of this patent is extended or adjusted under 35 U.S.C. 154(b) by 37 days.

(21) Appl. No.: 15/977,822

(22) Filed: May 11, 2018

(65) Prior Publication Data
US 2018/0366611 A1    Dec. 20, 2018

Related U.S. Application Data

(60) Provisional application No. 62/602,895, filed on May 11, 2017.

(30) Foreign Application Priority Data

May 11, 2017    (CA) .................................. 2967004

(51) Int. Cl.
*H01L 31/18*      (2006.01)
*H02N 1/04*      (2006.01)
(Continued)

(52) U.S. Cl.
CPC ........ *H01L 31/1884* (2013.01); *H01L 27/142* (2013.01); *H01L 27/16* (2013.01);
(Continued)

(58) Field of Classification Search
None
See application file for complete search history.

(56) References Cited

U.S. PATENT DOCUMENTS

| | | | |
|---|---|---|---|
| 2008/0210303 A1* | 9/2008 | Lu | ............ H01L 31/02168 136/260 |
| 2012/0156829 A1* | 6/2012 | Chen | ............ B82Y 10/00 438/99 |
| 2013/0276869 A1* | 10/2013 | No | ............ H01L 31/022483 136/251 |

OTHER PUBLICATIONS

Hasan et al., Performance and life prediction model for photovoltaic modules: effect of encapsulant constitutive behavior, SOlar Energy Mats & Solar Cells, 122, 2014, 75-87 (Year: 2014).*

(Continued)

*Primary Examiner* — Shannon M Gardner
(74) *Attorney, Agent, or Firm* — Procopio, Cory, Hargreaves & Savitch LLP

(57) ABSTRACT

There is described a cascade-type compact hybrid energy cell (CHEC) that is capable of individually and concurrently harvesting solar, strain and thermal energies. The cell comprises an n-p homojunction nanowire (NW)-based piezoelectric nanogenerator and a nanocrystalline/amorphous-Si:H single junction cell. Under optical illumination of ~10 $mW/cm^2$ and mechanical vibration of 3 $m/s^2$ at 3 Hz frequency, the output current and voltage from a single 1.0 $cm^2$-sized CHEC was found to be 280 μA and 3.0 V, respectively—this is are sufficient to drive low-power commercial electronics. Six such CHECs connected in series were found to generate enough electrical power to light emitting diodes or drive a wireless strain gauge sensor node.

22 Claims, 5 Drawing Sheets

(5 of 5 Drawing Sheet(s) Filed in Color)

(51) Int. Cl.

| | | |
|---|---|---|
| *H02N 2/18* | (2006.01) | |
| *H01L 41/053* | (2006.01) | |
| *H01L 41/047* | (2006.01) | |
| *H01L 35/24* | (2006.01) | |
| *H01L 41/18* | (2006.01) | |
| *H01L 41/113* | (2006.01) | |
| *H01L 31/048* | (2014.01) | |
| *H01L 41/29* | (2013.01) | |
| *H01L 27/16* | (2006.01) | |
| *H01L 31/0352* | (2006.01) | |
| *H01L 31/0392* | (2006.01) | |
| *H01L 29/06* | (2006.01) | |
| *H01L 31/046* | (2014.01) | |
| *H01L 27/142* | (2014.01) | |
| *H01L 35/32* | (2006.01) | |
| *H02S 10/10* | (2014.01) | |
| *H01L 31/075* | (2012.01) | |
| *H01L 35/14* | (2006.01) | |

(52) U.S. Cl.
CPC .... *H01L 29/0669* (2013.01); *H01L 31/03921* (2013.01); *H01L 31/03926* (2013.01); *H01L 31/035281* (2013.01); *H01L 31/046* (2014.12); *H01L 31/0481* (2013.01); *H01L 31/075* (2013.01); *H01L 35/14* (2013.01); *H01L 35/24* (2013.01); *H01L 35/32* (2013.01); *H01L 41/0478* (2013.01); *H01L 41/053* (2013.01); *H01L 41/113* (2013.01); *H01L 41/1136* (2013.01); *H01L 41/18* (2013.01); *H01L 41/29* (2013.01); *H02N 1/04* (2013.01); *H02N 2/18* (2013.01); *H02S 10/10* (2014.12)

(56) References Cited

OTHER PUBLICATIONS

Lu et al., Piezoelectric nanogenerator using p-type ZnO nanowire array, Nano Letters, 2009, vol. 9 No. 3, 1223-1227 (Year: 2009).*

* cited by examiner

CASCADE-TYPE HYBRID ENERGY CELL

CROSS-REFERENCE TO RELATED APPLICATION

The present application claims the benefit under 35 U.S.C. § 119(e) of provisional patent application Ser. No. 62/602,895, filed May 11, 2017 and the benefit under 35 U.S.C. § 119(a) Canadian patent application 2,967,004, filed May 11, 2017, the contents of which are hereby incorporated by reference.

BACKGROUND OF THE INVENTION

Field of the Invention

In one of its aspects, the present invention relates to a Cascade-type Hybrid Energy Cell (CHEC).

Description of the Prior Art

Solar [1-5] and vibration [6-8] energies are most commonly available in the ambient environment. They can be harvested, converted into electrical energy and used to operate autonomous wireless sensor networks (WSNs) [9]. However, vibrations generate power only while motion persists and solar energy is significant only when optical illumination is sufficient. Thus, a technology that can harvest energy from both sources would produce more reliable and substantial power output. The nanotechnology-based compact hybrid energy cell (CHEC) according to the presnt invention is believed to be able to individually and concurrently harvest vibrations and/or solar energies [10,11].

Various CHECs have been proposed for harvesting vibration, solar, thermal and chemical energies [10-29].

For example, functioning CHECs made of intrinsic ZnO nanowires (NWs) and organic polymer blends have been reported to harvest strain and solar energies [10-15]. Semiconductor NWs exhibit unique features for energy harvesting applications, such as enhanced surface area, high mechanical flexibility, high sensitivity to small forces, better charge collection, enhanced solar energy absorption through light trapping and amenability to function as a template for other structures [2,3]. On the other hand, the increased surface area in high aspect-ratio NW structures may also cause greater non-radiative recombination across local junctions/interfaces due to surface defects, which often undercuts these advantages [30-32].

In typical hybrid energy harvesters, the components that scavenge different types of energy are designed and fabricated independently, following distinct physical principles. Due to their different output characteristics, each energy harvesting modality requires its own power conversion and management circuitry. For example, piezoelectric nanogenerators (NGs) have large output impedance and can produce high voltage but low current, while solar cells (SCs) have small output impedance, with high current but low voltage [14].

Designing compact cells that can effectively and simultaneously harvest energy from multiple types of sources will increase their applicability and levels of output power. Complementary harvesting can also be used to improve the output characteristics by increasing output current and voltage simultaneously. Achieving these goals requires innovative and integrated methods, materials and structures [10, 11].

Thus, despite the advances made to date in the development of CHECs, there is room for improvement to address the above-mentioned problems and shortcomings of the prior art.

SUMMARY OF THE INVENTION

It is an object of the present invention to obviate or mitigate at least one of the above-mentioned disadvantages of the prior art.

It is another object of the present invention to provide a novel cascade-type compact hybrid cell or CHEC (also referred to in this specificiation as "a cascade-type hybrid solar and piezoelectric nanogenerator").

Accordingly, in one of its aspects, the present invention provides a cascade-type hybrid solar and piezoelectric (and/or triboelectric, and/or thermoelectric) nanogenerator comprising a laminate structure having the following elements:
(a) a substrate;
(b) an electrically insulating buffer layer;
(c) a first electrode element;
(d) a piezoelectric (and/or triboelectric, and/or thermoelectric) element configured to convert mechanic (and/or thermal) energy to electrical energy; and
(e) a solar cell element configured to convert optical energy to electrical energy; and
(f) a second electrode element;
wherein the nanogenerator further comprises an encapsulation element that encapsulates the laminate structure.

Thus, the present inventors have developed a novel CHEC. In a highly preferred embodiment, the CHEC is first cascade-type transparent vibration/solar energy cell synthesized on a polyethylene naphthalate (PEN) flexible substrate. This cascade-type CHEC monolithically-integrated two-terminal structure substantially suppresses the large interfacial electrical losses typically encountered in mechanically stacked devices. Furthermore, integrating the solar cell on top of the piezoelectric nanogenerator significantly enhances output power density, through effective, simultaneous and complementary harvesting of ambient strain and solar energies. In a preferred embodiment, the present CHEC consists of a vertically-aligned n-p ZnO homojunction NW-based nanogenerator and a hydrogenated nanocrystalline/amorphous silicon (nc/a-Si:H) $n^+$-i-$p^+$ junction solar cell. The full inorganic heterostructure of this preferred embodiment of the present CHEC improves chemical stability and mechanical durability. It is believed that the present CHEC can, for example, function as a sensor, a solar cell, a nanogenerator and the like.

In a preferred embodiment, the present compact hybrid energy cell (CHEC) is made of an inorganic solar cell monolithically integrated with a ZnO piezoelectric nanogenerator. The nanogenerator is made of vertically aligned n-p homojunction ZnO NWs hydrothermally grown on a flexible substrate. The solar cell is made of n+-i-$p^+$ nc/a-Si:H thin-films. As will be discussed hereinbelow, the fabricated CHECs have been demonstrated to harvest strain and solar energies individually and concurrently.

In a preferred embodiement mploying n-p junction based ZnO nanowires in the nanogenerator component improves the piezoelectric voltage output of the CHECs by more than two orders of magnitude (138 times). Under indoor ambient illumination and mechanical excitation with an acceleration of 3 m/s$^2$ at 3 Hz frequency, the output current and voltage from a single 1.0 cm$^2$-sized n-p junction-based CHEC were found to be 280 µA and 3.0 V, respectively—enough to drive low-power commercial electronics. Six such CHECs connected in series to charge a capacitor harnessed enough energy to light up 8 blue and 3 white LEDs in pulsed mode or to drive a wireless strain gauge sensor node intermittently.

This preferred embodiment of the present cascade-type ZnO n-p homojunction NW CHEC is believed to represent a significant step toward effective combined energy harvesting from the ambient environment, offering a flexible power supply for self-powered electronics.

The present CHEC can be used to exploit piezopotential under compressive strain and photovoltaic potential under ambient optical illumination, to generate electrical power. The CHECs, when placed solely under optical illumination, function as traditional solar cells and produce continuous photocurrent output. The photocurrent flows from the solar cell component. When a compressive force is applied, negative piezopotential (V−) is generated at the one interface (bottom) and positive piezopotential (V+) at the other interface (the top) of the nanogenerator layers. The photovoltaic potential and the piezopotential are in the same direction and thus the generated electrical power add on together. The combined potential creates a stronger voltage drop between the positive (top) port and the negative (bottom) port, which drives current through an external load.

The buffer layer (such as SiN) improves the surface properties of the substrate.

In a preferred emodiment one seed layer (such as AZO layer) is deposited on the buffer layer and serves as a conductive electrode as well as a seed layer for subsequent nanowire growth (such as ZnO Nanowires).

In another preferred embodiment, one or both of the first electrode and the second electrode may comprise a transparent material and a conductive silver paste.

In another preferred embodiment, the solar cell element may comprise multiple layers; one example is one n-doped nanocrystal/amorphous hydrogenated silicon thin-film (n-nc/a-Si:H), intrinsic nanocrystal/amorphous hydrogenated silicon thin-film (i-nc/a-Si:H) and p-doped nanocrystal/amorphous hydrogenated silicon thin-film (p-nc/a-Si:H).

The above-mentioned laminate structure is is encapsulated by an encapsulation element. Preferably, the encapsulation element substantially completely encompasulates the laminate structure. One non-limiting example of the encapsulation layer is PDMS, Dow Corning Sylgard™ 184 premixed with curing agent at a ratio of 10:1 w/w and degassed, to prevent contamination, damage, and moisture penetration from the ambient environment.

The present CHEC may used not only for energy harvesting purposes, but also for sensing, detecting and for other functions.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Embodiments of the present invention will be described with reference to the accompanying drawings, wherein like reference numerals denote like parts, and in which.

DETAILED DESCRIPTION OF THE PREFERRED EMBODIMENTS

Figure 1A:
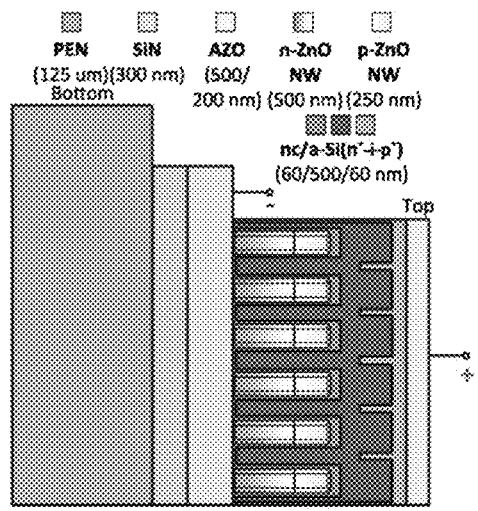
FIG. 1A illustrates a schematic diagram of a preferred CHEC according to the invention made of n-p homojunction ZnO NWs grown on a flexible substrate (cross sectional view)

The present invention relates to a cascade-type hybrid solar and piezoelectric (and/or triboelectric, and/or thermoelectric) nanogenerator comprising a laminate structure having the following elements: (a) a substrate; (b) an electrically insulating buffer layer; (c) a first electrode element; (d) a piezoelectric (and/or triboelectric, and/or thermoelectric) element configured to convert mechanic (and/or thermal) energy to electrical energy; and (e) a solar cell element configured to convert optical energy to electrical energy; and (f) a second electrode element; wherein the nanogenerator further comprises an encapsulation element that encapsulates the laminate structure.

Preferred embodiments of this cascade-type hybrid solar and piezoelectric (and/or triboelectric, and/or thermoelectric) nanogenerator may include any one or a combination of any two or more of any of the following features:

the substrate is a polymer;
the substrate is a non-polymeric material;
the substrate comprises a flexible material;

the substrate comprises a rigid material;
the substrate comprises polyethylene naphthalate (PEN);
the substrate comprises aluminium;
the substrate comprises a silicon wafer;
the buffer layer is a polymer;
the buffer layer is a non-polymeric material;
the buffer layer comprises silicon nitride (SiN);
the buffer layer comprises silicon dioxide ($SiO_2$);
the buffer layer comprises aluminum oxide;
the first electrode comprises an optically-transparent first electrode;
the first electrode comprises a layer aluminum-doped zinc oxide (AZO)), for example 2 wt. % $Al_2O_3$+98 wt. % ZnO;
the first electrode comprises a layer indium tin oxide (ITO) layer;
the piezoelectric element comprises a n-p homojunction ZnO piezoelectric nanogenerator element;
the piezoelectric element comprises an InN nanowire-based piezoelectric nanogenerator element;
the solar cell element comprises a $n^+$-i-$p^+$ nanocrystal/armouphous Si:H thin-film;
the triboelectric element comprises multiple layers of polymers;
the triboelectric element comprises multiple layers of non-polymeric materials;
the thermoelectric element comprises single or multiple layers of organic and/or inorganic materials;
the second electrode comprises an optically-transparent second electrode;
The cascade-type hybrid solar and piezoelectric (and/or triboelectric, and/or thermoelectric) nanogenerator defined in claim 1-19, wherein the second electrode comprises a layer aluminum-doped zinc oxide (AZO), for example 2 wt. % $Al_2O_3$+98 wt. % ZnO
the second electrode comprises a layer indium tin oxide (ITO) layer;
the first electrode and the second electrode are the same;
the first electrode and the second electrode are different;
The cascade-type hybrid solar and piezoelectric (and/or triboelectric, and/or thermoelectric) nanogenerator defined in claim 1-27, wherein the encapsulation element is a polymer.
the encapsulation element is a non-polymeric material;
the encapsulation element comprises polydimethylsiloxane (PDMS);
one or both of the buffer layer and the the first electrode are deposited onto the substrate using a physical deposition method;
both of the buffer layer and the the first electrode are deposited onto the substrate using a physical deposition method;
the physical deposition method radio-frequency (RF) magnetron sputtering at 150° C.;
the piezoelectric element is grown on the first electrode by a physical deposition method;
the piezoelectric element is grown on the first electrode by a chemical deposition method;
the piezoelectric element comprises a n-p homojunction ZnO piezoelectric nanogenerator element comprising ZnO homojunction nanowires that are are grown using a hydrothermal method;
the hydrothermal method comprises as follows: providing an aqueous solution for growing n-type ZnO nanowires, the aqueous solution comprising a mixture of zinc (Zn) nitrate hexahydrate (25 mM), hexamethylenetetramine (25 mM) and aluminum (Al) nitrate nonahydrate, wherein the atomic ratio of Al to (Al+Zn) in the mixture solution is controlled at 3 wt. %; adding a doping agent (such as lithium (Li) nitrate (75 mM)) to the solution (heavily p-type); maintaining the aqueous solution at a substantially constant temperature of 88° C. during growt of the nanowires; and controlling the length of the ZnO nanowire by growth time (~500 nm/hour): one hour for the n-type section immediately followed by an additional half hour for the Li-doped p-type section;
the solar cell element comprises a plurality of layers with on least one of the plurality of layers being configure for optical absorption;
the plurality of layers in the solar cell element comprises a stack of $n^+$-i-$p^+$ nanocrystal/amorphous —Si:H thin-film layers;
the thin-film layers are deposited on top of the piezoelectric element by plasma-enhanced chemical-vapor deposition (PECVD);
the thin-film layers are deposited on top of the piezoelectric element by plasma-enhanced chemical-vapor deposition (PECVD) at a substrate growth temperature of 150° C.; and/or
any two, or three or four of the piezoelectric element, the triboelectric element, the solar cell element and the thermoelectric element can be integrated in series or in parallel to maximize the energy conversion efficiency of the hybrid device.

Preferred embodiments of the present invention will be described with reference to the following explemary information which should not be used to limit or construe the invention.

ZnO n-p Homojunction NW Growth

The ZnO homojunction NWs are grown hydrothermally [33]. A SiN buffer layer and aluminum-doped ZnO (AZO, 2 wt % $Al_2O_3$+98 wt % ZnO) layer are deposited onto a pre-cleaned polyethylene naphthalate (PEN) substrate using radio-frequency (RF) magnetron sputtering at 150° C. The SiN buffer layer improves the surface properties of the substrate. The AZO layer serves as a conductive electrode as well as a seed layer for subsequent ZnO NW growth.

The aqueous solution for growing n-type ZnO NWs is a mixture of zinc (Zn) nitrate hexahydrate (25 mM), hexamethy-lenetetramine (25 mM) and aluminum (Al) nitrate nonahydrate. The atomic ratio of Al to (Al$^+$Zn) in the mixture solution is controlled at 3 wt %. To obtain p-type ZnO NWs, a doping reagent, lithium (Li) nitrate (75 mM), is added to the solution (heavily p-type). The solution is kept at a constant temperature of 88° C. during growth, and the ZnO NW length is simply controlled by growth time (~500 nm/h): one hour for the n-type section immediately followed by an additional half hour for the Li-doped p-type section. Additionally, the n-n homojunction NWs are prepared with intrinsic (effectively n-type) NW growth procedure for use as control samples in the experiments [33]. All samples are cleaned using a standard process.

Fabrication of the Compact Hybrid Energy Cell

The solar component of the CHECs consists of a stack of $n^+$-i-$p^+$ nc/a-Si:H thin-film layers, deposited on top of the synthesized n-p and n-n homojunction ZnO NWs by plasma-enhanced chemical-vapor deposition (PECVD) at a substrate growth temperature of 150° C. A 13.56 MHz PECVD cluster system is first used to deposit 60 nm of $n^+$ nanocrystalline (nc)-Si:H thin-film onto the NW array at an RF power density of 194 mW/cm$^2$, using a combination of $SiH_4$/$H_2$/$pH_3$ gases. Immediately after, a 500 nm thick i-a-Si:H intrinsic absorber layer is deposited at a power density of 9 mW/cm² by flowing SiH₄, followed by 60 nm of p⁺ nanocrystalline (nc)-Si:H deposited at a power density of 43 mW/cm2 using SiH₄/H₂/B₂H₆ process gases. Lastly, a 200 nm thick AZO layer is deposited as a transparent front contact.

Photolithography is then employed to pattern the stack into arrays of square CHECs. Silver conductive paste is used to glue Cu wire leads onto the top and bottom AZO electrodes. The completed stacks are packaged in polydimethylsiloxane (PDMS), Dow Corning Sylgard 184, premixed with curing agent at a ratio of 10:1 w/w, and then degassed to prevent contamination, damage, and moisture penetration from the ambient environment.

Structural and Device Characterization

The morphology of the as-grown ZnO NWs is obtained using a Zeiss Orion Plus helium ion microscope (HIM). Optical characterization of the NW structures is performed using a UV/Visible spectrophotometer (Shimadzu, UV-2501PC). The ZnO nanowires in the CHECs were grown following methods validated in a previous study [34] and shown to successfully incorporate Li ions into the ZnO lattice, resulting in p-type doped nanowires. The current-voltage (I-V) curves of the CHECs and their junction capacitance are measured using a Keithley 4200-SCS semiconductor characterization system, calibrated before measurement to keep the system noise at or below 1 fF in a wide frequency range (1 kHz-10 MHz).

The photovoltaic parameters are measured under 1-sun AM 1.5 G radiation from an ABET Sun 3000 Class AAA solar simulator with a Keithley 2400 source/meter. Piezoelectric characterization is carried out using a system that includes a closed-loop controller (Vibration Research Corporation, VR9500) and a linear shaker (Labworks Inc., ET-126B-1) to provide sinusoidal waves simulating a vibration source with a known amplitude and frequency. Output piezoelectric voltage and current signals are measured using low-noise voltage/current preamplifiers (Stanford Research System Model SR560/570) and a National Instruments I/O module (NI CompactDAQ USB-9239). The input resistances of the voltage and current preamplifiers are 100 MΩ (SR560) and 10 kΩ (SR570), respectively. To minimize electromagnetic interference, the two copper wires connected to the device under test are twisted together. All measurements are conducted at ambient room temperature.

Results and Discussion

Figure 1C:
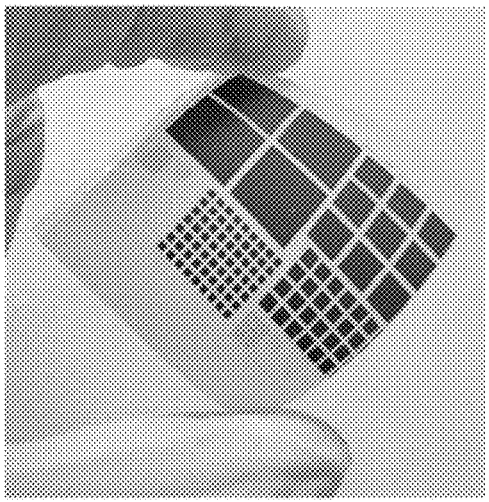
FIG. 1C is a photograph of patterned CHEC arrays according to the invention.
Figure 1B:
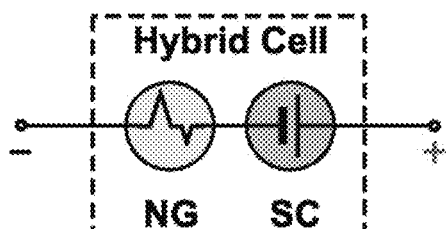
FIG. 1B illustrates a schematic showing an equivalent circuit of the hybrid energy cell.

FIG. 1a shows a schematic diagram of a fabricated CHEC and its architecture. An equivalent circuit of the CHEC, showing the NG and SC connected in series, appears in FIG. 1b. The nc/a-Si:H n⁺-i-p⁺ layers are integrated directly on top of the underlying lithium-doped ZnO nanowire layer. Two types of ZnO NWs are employed in the device fabrication: ZnO n-p homojunction NWs and ZnO n-n homojunction NWs. FIG. 1c shows a photograph of the patterned array of CHECs with varying side lengths (from 1 mm to 1 cm) and insulation separation. This array configuration provides the basis for effectively comparing the output for a range of CHECs.

Figure 1D:
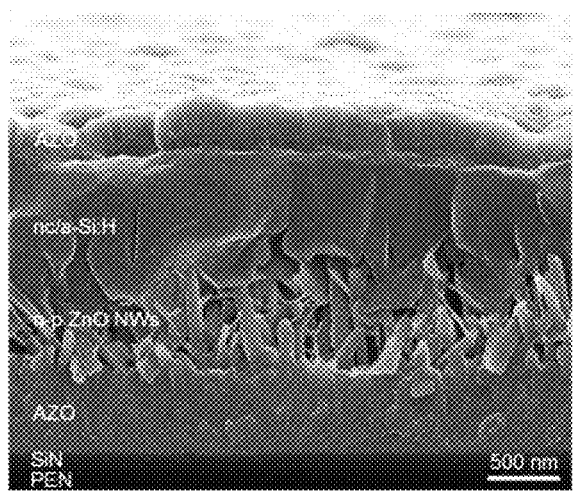
FIG. 1D illustrates a cross-sectional helium ion microscopy (HIM) image of a fabricated CHEC according to the invention.
Figure 1E:
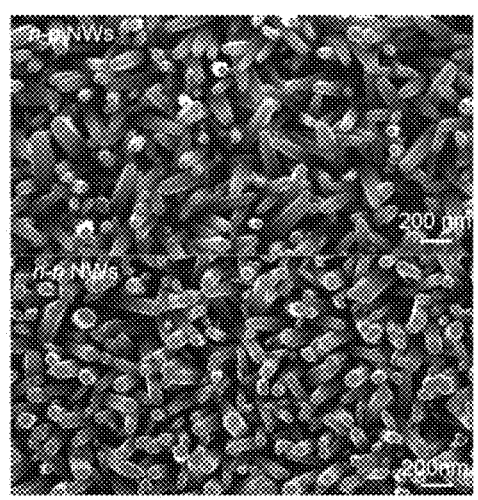
FIG. 1E illustrates HIM images of the n-p (top) and n-n (bottom) homojunction ZnO NW arrays.

FIG. 1d shows a cross-sectional helium ion microscope (HIM) image of a typical CHEC, and confirms the monolithic and seamless integration between the nc/a-Si:H n⁺-i-p⁺ layers and the underlying ZnO NW layer. The ZnO NWs are functioning as the piezoelectric material for mechanical energy conversion and as the electron transport layer for photocurrent collection of the solar cell component. FIG. 1e shows top-view HIM images of the as-grown n-p and n-n homojunction ZnO NWs, revealing uniform growth of high-density and vertically-aligned NWs. The average length and diameter of these NWs are ~750 nm and 80 nm, respectively.

This monolithic CHEC can exploit piezopotential under compressive strain and photovoltaic potential under ambient optical illumination, to generate electrical power. The CHECs, when placed solely under optical illumination, function as traditional solar cells and produce continuous photocurrent output. The photocurrent flows from the n⁺-nc-Si layer to the p⁺-nc-Si layer, or from the left (the bottom) to the right (the top), as illustrated in FIG. 1a.

When a compressive force is applied, negative piezopotential (V+) is generated at the AZO/n-ZnO NW interface (bottom) and positive piezopotential (V+) at the p-ZnO NW/n⁺-nc-Si interface (the top). The photovoltaic potential and the piezopotential are in the same direction and thus are added together [11]. The combined potential creates a stronger voltage drop between the positive (top) port and the negative (bottom) port, which drives current through an external load. Owing to the high interfacial energy barrier, electrons accumulate at the interface between the p⁺-nc-Si layer and top AZO electrode until the resulting potential balances the piezopotential in an equilibrium state. Once the compressive load is released, the piezopotential drops to zero, and the electrons accumulated around the p⁺-nc-Si layer flow back to the bottom AZO electrode via the external circuit. Consequently, a negative electric pulse is generated and the system returns to its initial equilibrium state [35].

Figure 2A:
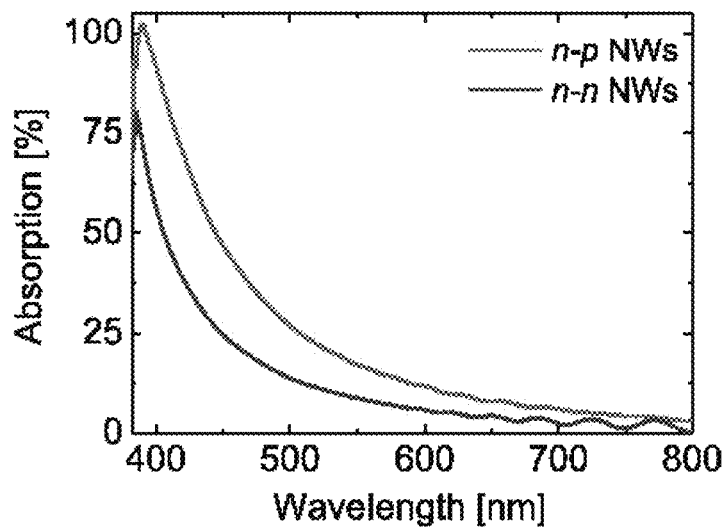
FIG. 2A illustrates the measured optical absorption spectra for the n-p and n-n ZnO homojunction NWs.

FIG. 2a shows the measured optical absorption spectra of the n-p and n-n homojunction ZnO NW arrays in the wavelength range of 380-800 nm. The peak absorption wavelength is observed at $\lambda$=~385 nm in the n-n homojunction ZnO NWs, corresponding to a bandgap energy of ~3.2 eV. This absorption feature can be at tributed to the interband optical transition near the conduction/valence band edges of ZnO. The peak absorption in the n-p homojunction NWs exhibits a slight red shift to a longer wave-length of ~390 nm. The n-p homojunction ZnO NWs also show stronger optical absorption over the visible and near-infrared wavelength range compared with the n-n homojunction ZnO NW arrays. The shift in peak wavelength and stronger optical absorption of n-p type CHECs enhance photocurrent generation and may improve solar photon harvesting. A few absorption strength oscillations can be observed in the wavelength range between 600 and 800 nm, and can be attributed to the Fabry-Perot resonance along the layer growth direction.

Figure 2B:
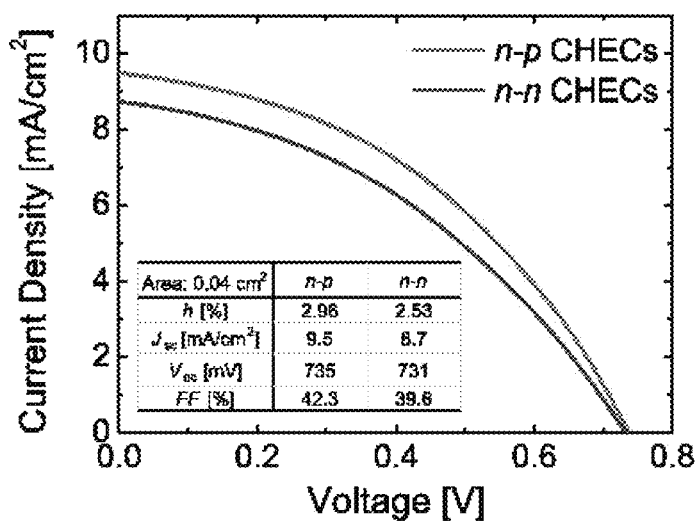
FIG. 2B illustrates current density-voltage (J-V) characteristics of 2 mm n-p and n-n CHECs under AM 1.5 G illumination with 100 mW/cm$^2$ light intensity.

FIG. 2b shows the current density-voltage (J-V) curves of the 2 mm-sized n-n and n-p CHECs under AM 1.5 G illumination with 100 mW/cm² light intensity and no mechanical strain. The n-n CHECs produce a short-circuit current density ($J_{sc}$) of 8.7 mA/cm², an open-circuit voltage (Voc) of 0.731 V, a cell fill factor (FF) of 39.6%, and a power conversion efficiency ($\eta$) of 2.53%. The CHECs with n-p homojunction NWs achieve a higher current density ($J_{sc}$) of 9.5 mA/cm² and efficiency ($\eta$) of 2.96%, but similar voltage ($V_{oc}$) of 0.735 V and FF of 42.3%. The devices' low solar power conversion efficiency (PCE) is attributed to the roughness of the surfaces and interfaces among the solar cell layers due to their deposition on top of ZnO NWs, roughness further exacerbated by a soft substrate. While not wishing to be bound by any particular theory or mode of action, the marginal improvement in the output current and efficiency of the n-p CHECs over those of the n-n CHECs is believed to be attributable to the marginally superior optical absorption and the lower internal impedance of n-p homojunction NWs.

Figure 5A:
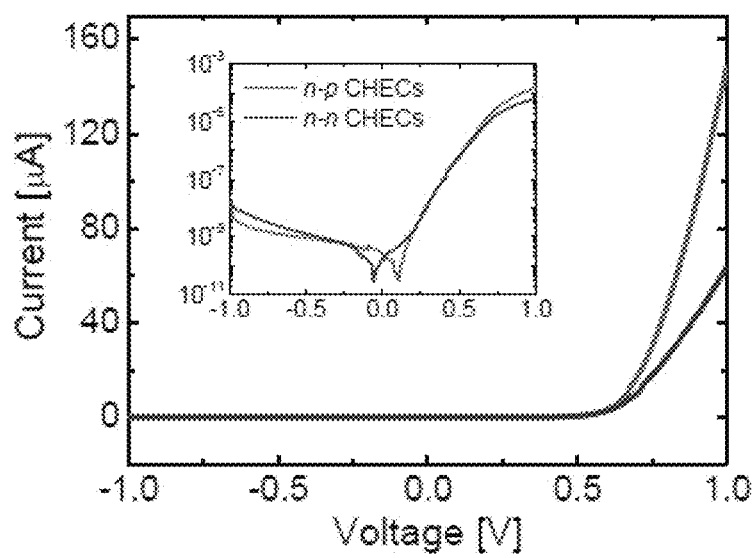
FIG. 5A illustrates the measured current-voltage (i-V) characteristics of the n-pand n-nCHECs (inset shows thecorresponding semilog i-Vplot) under dark conditions and no mechanical strain.

Larger 1 cm-sized CHECs were used to harvest more solar and mechanical energies. FIG. 5A shows a typical current-voltage (I-V) curve under dark conditions and no mechanical strain, with an inset of a corresponding semilog I-V plot. Almost zero current passes through the CHECs until the voltage exceeds a threshold voltage. A rectifying characteristic is clearly exhibited, demonstrating that the n-p and n-n homojunction NWs and $n^+$-i-$p^+$ Si thin film behave as well-defined diodes. The rectification ratio of the n-p CHECs is 1.32×104 at bias voltages of −1 and +1 V. The turn-on voltage is approximately 0.7 V for both types of CHECs.

Figure 5B:
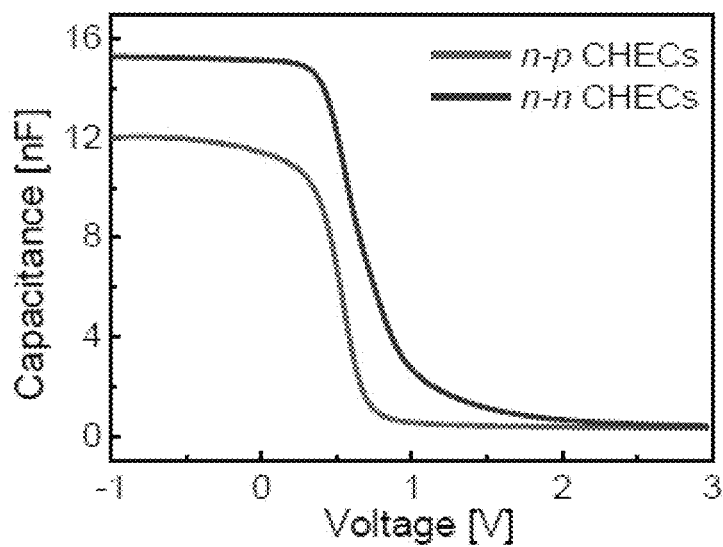
FIG. 5B illustrates the capacitance-voltage responses for 1 cm side length n-pand n-nCHECs. The AC signal was set to 10 mV at 5 k Hz. All the C-V measurements were performed under dark conditions and no mechanical strain with a bias varyingfrom -1.0 to 3.0 V.

The capacitance-voltage responses were measured (FIG. 5B) to further reveal the electrical properties of the CHECs. The AC signal was set to 10 mV at 5 kHz, while the DC bias was varied from −1 V to +3 V. The anode was connected to the top AZO layer and the cathode to the bottom AZO layer. The results show that capacitance saturates at a larger value for a negative bias voltage (~12 nF for n-p CHECs, ~15 nF for n-n CHECs) and at a much smaller value for bias voltages (~0.4 nF for both CHECs) in the range of 1-3 V. The measured capacitance exhibits a sharp drop as the DC bias increases from 0 to +1 V. The n-p CHECs have lower capacitance than the n-n CHECs because of the additional junction capacitance associated with the n-p ZnO homojunction connected in series with the interface capacitance of p-ZnO NW/$n^+$-nc-Si and the junction capacitance of $n^+$-i-$p^+$ Si, resulting in a smaller overall CHEC capacitance.

Figure 3A:
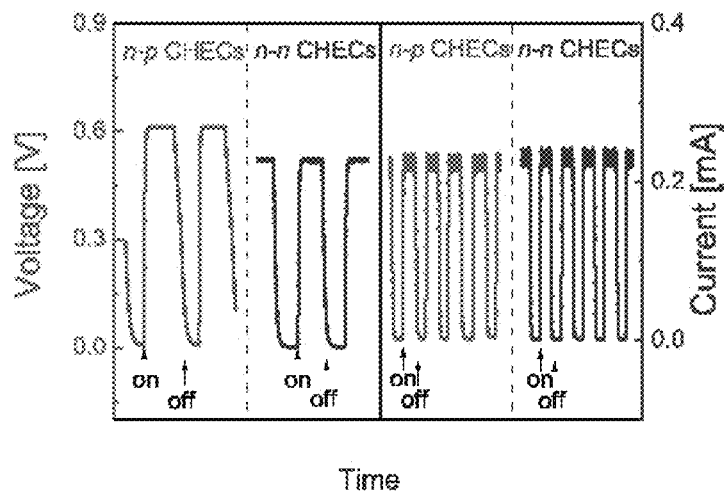
FIG. 3A illustrates the open-circuit voltage and short-circuit current of n-p and n-n CHECs at ambient indoor optical illumination level (~10 mW/cm$^2$) and no mechanical strain.

FIG. 3a shows the voltage output of the 1 cm-sized CHECs under indoor ambient optical illumination (~10 mW/cm$^2$) and no mechanical strain. DC-type photovoltaic output was obtained by repeatedly turning the indoor light source on and off at 2 s and 1 s intervals. The n-p CHECs yield a higher open-circuit voltage (0.6 V) than the n-n CHECs (0.55 V), but comparable current output (280 μA). From FIG. 5A, the resistance of the n-p CHECs is derived to be 1.7 kΩ at 1 V, lower than the resistance (4.5 kΩ) of the n-n CHECs. The overall impedance obtained from combining these resistances with the measured capacitance are (1.67 kΩ) for n-p type CHECs and (4.27 kΩ) for n-n CHECs.

Figure 3B:
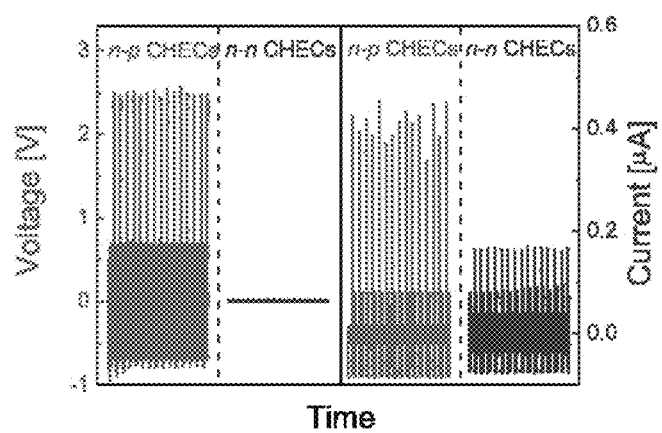
FIG. 3B illustrates the open-circuit voltage and short-circuit current of n-p and n-n CHECs at an acceleration amplitude of 3 m/s$^2$ and a frequency of 3 Hz under dark conditions.

The piezoelectric response of the CHECs under dark conditions is measured and presented in FIG. 3b. The CHECs were anchored on a fixed stopper, and the shaker moved back and forth, applying periodic strain to the NWs by striking the CHECs at the end of each cycle [34, 36]. The excitation frequency was set to 3 Hz, and the acceleration amplitude to 3 m/s$^2$.

AC-type piezoelectric output—positive and negative current passing through the external load—can be observed as the n-p homojunction-based NGs (PNGs) undergo cyclic mechanical strain, similar to results reported elsewhere [35, 37-39]. In this CHEC, the AC signal is produced from the PNG part, while a positive DC signal is observed from the SC under light illumination. The results show that the open-circuit voltage Voc of the n-p CHECs is 138 times higher than that of the n-n CHECs, reaching a maximum of +2.5 V, and the maximum short-circuit current Isc is more than twice that of the n-n CHECs. The improved $V_{oc}$ and $I_{sc}$ can be attributed to the substantial reduction in mobile charge screening effect observed in the n-p homojunction. [34, 40].

Although the solar cell (SC) component of the CHECs produces a relatively higher output current—on the order of mA—its output voltage is only around 0.5-0.6 V. Conversely, the output voltage of the PNG can be as high as several volts, but its output current is less than 1 μA. Hence, a hybridization of the SC and NG could exploit both of their advantages, yielding a higher output current and higher output voltage device.

Figure 3C:
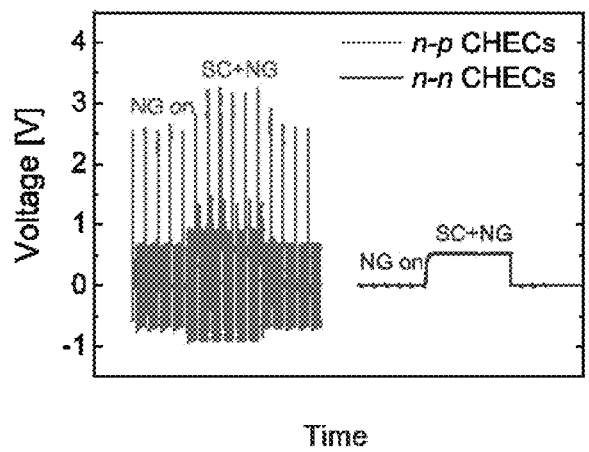
FIG. 3C illustrates the output voltage of the CHECs for combined harvesting of ambient indoor optical illumination of ~10 mW/cm$^2$ and an acceleration amplitude and frequency of 3 m/s$^2$ and 3 Hz, respectively.

To demonstrate simultaneous harvesting of solar and mechanical energies, the CHECs were tested under indoor optical illumination and mechanical strain. The measured open-circuit voltage is shown in FIG. 3c. During the experiment, an acceleration amplitude of 3 m/s$^2$ at 3 Hz frequency was applied continuously. An indoor illumination of 10 mW/cm$^2$ was applied for a short period (2 s), and then dark conditions were resumed. For the n-p CHECs, the maximum output voltage exceeds 3 V under both optical and mechanical excitation. The results show that the voltage outputs from the SC component and the NG component combine constructively, verifying that the CHEC can simultaneously and individually harvest solar and mechanical energies. The add-on effect is negligible (the right curve in FIG. 3c) in the n-n CHECs because the piezoelectric voltage output is quite small.

Figure 4A:
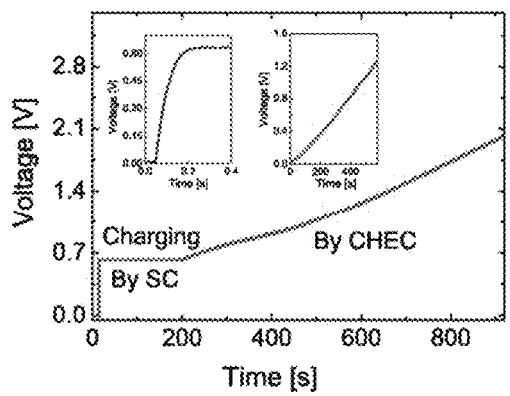
FIG. 4A illustrates the charging curves of a 10 μF capacitor being charged by an n-p individual CHEC according to the invention (the insets are the curves for the NG and SC components, separately)

The hybrid energy cell's potential to charge capacitors, power LEDs, and drive wireless sensor nodes is illustrated using the n-p CHECs under ~10 mW/cm$^2$ illumination and an acceleration amplitude of 3 m/s$^2$ at 3 Hz frequency. Their pulsed voltage output is rectified using a full-wave bridge. FIG. 4a shows the charging curves of a 10 μF capacitor charged by a 1 cm-sized CHEC. Under optical illumination only, the capacitor can be charged from 0 V to 0.61 V in less than 0.3 s. Voltage remains constant afterwards (left inset, FIG. 4a). Under mechanical excitation only, the voltage across the capacitor increases slowly and almost linearly, reaching 1.27 V in 580 s (right inset, FIG. 4a). Under combined optical and mechanical input, the CHEC charges the same capacitor to a voltage of 2.0 V in 920 s. Comparison indicates that the hybrid cell can effectively compensate for the lower voltage output of the solar cell component.

Figure 4B:
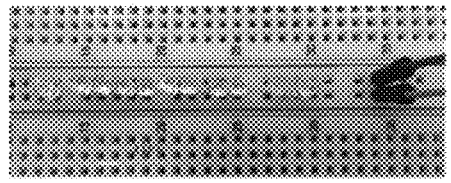
FIG. 4B is a photograph of eight blue and three white LEDs before and after being powered by a charged 1000 μF capacitor.
Figure 4B:
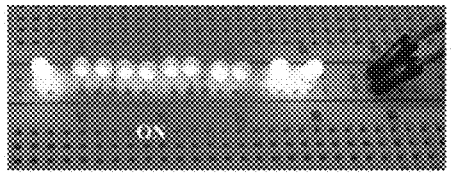

To enhance the CHEC's output, six cells were integrated in series to charge a 1000 μF capacitor. The capacitor was then deployed to power eight blue and three white LEDs connected in parallel. The emitted light lasted for 0.5-1.0 s and is clearly captured against the background, in FIG. 4b.

Figure 4C:
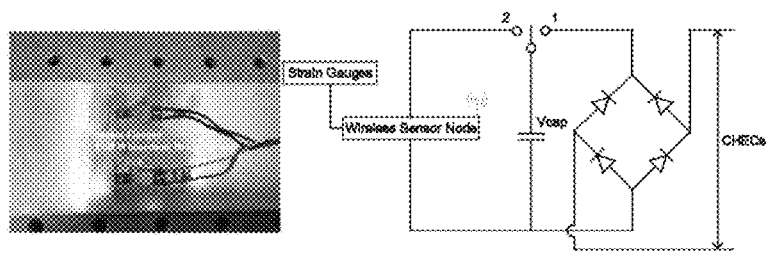
FIG. 4C is a photograph of two commercial strain gauges (the front-side of a Wheatstone bridge) incorporated into the wireless sensor node.
Figure 4D:
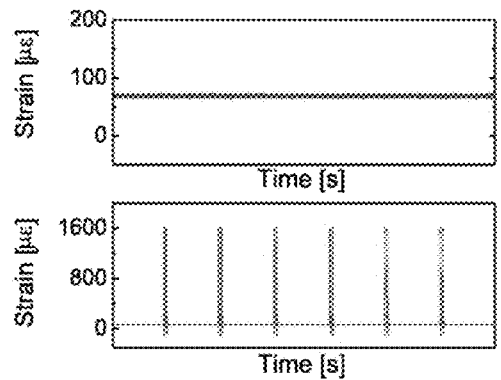
FIG. 4D illustrates the measured strain signals (top) without vibration and (bottom) with vibration from the wireless strain gauge sensor.

The of the CHEC to sustainably drive a wireless sensor node was tested on a commercial EH-LINK wireless sensor (strain gauge) node (LORD Corporation). On this node, the output of six CHECs connected in series was first rectified by the full-wave bridge. The charge was stored in the 1000 μF capacitor. A full Wheatstone bridge was implemented using four 350Ω commercial strain gauge sensors (Vishay precision group) (FIG. 4c) to measure the strain at the instrumented root of a cantilever beam. The wireless strain sensor node was used to transmit the measured strain signal to a USB base station connected to a computer that acquired and recorded data. FIG. 4d shows the recorded strain signals obtained from this experimental setup. The strain in the beam was measured by the wireless sensor node powered by an electronic circuit consisting of the CHECs, the capacitor, and the full-wave bridge. Depending on whether the beam was under mechanical excitation or not, measurable strain signals were recorded (lower graph) or not (upper graph, FIG. 4d). When the excitation frequency of the beam was set to 3 Hz and the acceleration amplitude to 3 m/s$^2$, the intermittently-measured strain was about 1600με. These results demonstrate that the CHECs are capable of powering commercial electronics.

Thus, the above exemplary work done by the present inventors demonstrates a compact hybrid energy cell (CHEC) made of an inorganic solar cell monolithically integrated with a ZnO piezoelectric nanogenerator. The nanogenerator was made of vertically aligned n-p homojunction ZnO NWs hydrothermally grown on a flexible substrate. The solar cell was made of n+-i-p+ nc/a-Si:H thin-films. The fabricated CHECs were demonstrated to harvest strain and solar energies individually and concurrently. Employing n-p junction based ZnO nanowires in the nanogenerator component improves the piezoelectric voltage output of the CHECs by more than two orders of magnitude (138 times). Under indoor ambient illumination and mechanical excitation with an acceleration of 3 m/s$^2$ at 3 Hz frequency, the output current and voltage from a single 1.0 cm-sized n-p junction-based CHEC were 280 μA and 3.0 V, respectively, enough to drive low-power commercial electronics. Six such CHECs connected in series to charge a capacitor harnessed enough energy to light up 8 blue and 3 white LEDs in pulsed mode or to drive a wireless strain gauge sensor node intermittently. This example of the present cascade-type ZnO n-p homojunction NW CHEC is believed to represent a significant step toward effective combined energy harvesting from the ambient environment, offering a flexible power supply for self-powered electronics.

While this invention has been described with reference to illustrative embodiments and examples, the description is not intended to be construed in a limiting sense. Thus, various modifications of the illustrative embodiments, as well as other embodiments of the invention, will be apparent to persons skilled in the art upon reference to this description. It is therefore contemplated that the appended claims will cover any such modifications or embodiments.

All publications, patents and patent applications referred to herein are incorporated by reference in their entirety to the same extent as if each individual publication, patent or patent application was specifically and individually indicated to be incorporated by reference in its entirety.

CITED REFERENCES

[1] M. Law, L. E. Greene, J. C. Johnson, R. Saykally, P. Yang, Nat. Mater. 4 (2005) 455.
[2] C. M. Hsu, C. Battaglia, C. Pahud, Z. Ruan, F. J. Haug, S. Fan, C. Ballif, Y. Cui, Adv. Energy Mater. 2 (2012) 628.
[3] J. Jean, S. Chang, P. R. Brown, J. J. Cheng, P. H. Rekemeyer, M. G. Bawendi, S. Gradečak, V. Bulović, Adv. Mater. 25 (2013) 2790.
[4] W. U. Huynh, J. J. Dittmer, A. P. Alivisatos, Science 295 (2002) 2425.
[5] L. Li, S. Chen, X. Wang, Y. Bando, D. Golberg, Energy Environ. Sci. 5 (2012) 6040.
[6] S. Xu, B. J. Hansen, Z. L. Wang, Nat. Commun. 1 (2010) 93.
[7] Y. Hu, Y. Zhang, C. Xu, L. Lin, R. L. Snyder, Z. L. Wang, Nano Lett. 11 (2011) 2572.
[8] J. Chen, G. Zhu, J. Yang, Q. Jing, P. Bai, W. Yang, X. Qi, Y. Su, Z. L. Wang, ACS Nano 9 (2015) 105.
[9] Z. L. Wang, Adv. Mater. 24 (2012) 280.
[10] C. Xu, Z. L. Wang, Adv. Mater. 23 (2011) 873.
[11] D. Choi, K. Y. Lee, M.-J. Jin, S.-G. Ihn, S. Yun, X Bulliard, W. Choi, S. Y. Lee, S.-W. Kim, J.-Y. Choi, Energy Environ. Sci. 4 (2011) 4607.
[12] C. Xu, X. Wang, Z. L. Wang, J. Am. Chem. Soc. 131 (2009) 5866.
[13] Y. Yang, H. Zhang, G. Zhu, S. Lee, Z.-H. Lin, Z. L. Wang, ACS Nano 7 (2012) 785.
[14] C. Pan, W. Guo, L. Dong, G. Zhu, Z. L. Wang, Adv. Mater. 24 (2012) 3356.
[15] C. Yoon, K.-S. Shin, M. K. Gupta, K. Y. Lee, J.-H. Lee, Z. L. Wang, S.-W. Kim, Nano Energy 12 (2015) 547.
[16] Y. Zi, L. Lin, J. Wang, S. Wang, J. Chen, X. Fan, P. K. Yang, F. Yi, Z. L. Wang, Adv. Mater. 27 (2015) 2340.
[17] J. H. Lee, K. Y. Lee, M. K. Gupta, T. Y. Kim, D. Y. Lee, J. Oh, C. Ryu, W. J. Yoo, C. Y. Kang, S. J. Yoon, Adv. Mater. 26 (2014) 765.
[18] L. Zheng, G. Cheng, J. Chen, L. Lin, J. Wang, Y. Liu, H. Li, Z. L. Wang, Adv. Energy Mater. (2015).
[19] Y. Yang, H. Zhang, J. Chen, S. Lee, T.-C. Hou, Z. L. Wang, Energy Environ. Sci. 6 (2013) 1744.
[20] Y. Yang, H. Zhang, Y. Liu, Z.-H. Lin, S. Lee, Z. Lin, C. P. Wong, Z. L. Wang, ACS Nano 7 (2013) 2808.
[21] Y. Yang, H. Zhang, S. Lee, D. Kim, W. Hwang, Z. L. Wang, Nano Lett. 13 (2013) 803.
[22] Y. Hu, J. Yang, S. Niu, W. Wu, Z. L. Wang, ACS Nano 8 (2014) 7442.
[23] G. Cheng, Z.-H. Lin, Z.-l Du, Z. L. Wang, ACS Nano 8 (2014) 1932.
[24] X. Wang, S. Wang, Y. Yang, Z. L. Wang, ACS Nano 9 (2015) 4553.
[25] Y. Yang, H. Zhang, Z.-H. Lin, Y. Liu, J. Chen, Z. Lin, Y. S. Zhou, C. P. Wong, Z. L. Wang, Energy Environ. Sci. 6 (2013) 2429.
[26] B. J. Hansen, Y. Liu, R. Yang, Z. L. Wang, ACS Nano 4 (2010) 3647.
[27] R. Yang, Y. Qin, C. Li, G. Zhu, Z. L. Wang, Nano Lett. 9 (2009) 1201.
[28] S. Lee, S.-H. Bae, L. Lin, S. Ahn, C. Park, S.-W. Kim, S. N. Cha, Y. J. Park, Z. L. Wang, Nano Energy 2 (2013) 817.
[29] C. Xu, C. Pan, Y. Liu, Z. L. Wang, Nano Energy 1 (2012) 259.
[30] C. Pan, S. Niu, Y. Ding, L. Dong, R. Yu, Y. Liu, G. Zhu, Z. L. Wang, Nano Lett. 12 (2012) 3302.
[31] Z. Wang, R. Yu, X. Wen, Y. Liu, C. Pan, W. Wu, Z. L. Wang, ACS Nano 8 (2014) 12866.
[32] J. C. Shin, P. K. Mohseni, K. J. Yu, S. Tomasulo, K. H. Montgomery, M. L. Lee, J. A. Rogers, X. Li, ACS Nano 6 (2012) 11074.
[33] L. E. Greene, M. Law, J. Goldberger, F. Kim, J. C. Johnson, Y. Zhang, R. J. Saykally, P. Yang, Angew. Chem. Int. Ed. 42 (2003) 3031.
[34] G. Liu, E. Abdel-Rahman, D. Ban, J. Appl. Phys. 118 (2015) 094307.
[35] K. Y. Lee, B. Kumar, J.-S. Seo, K.-H. Kim, J. I. Sohn, S. N. Cha, D. Choi, Z. L. Wang, S.-W. Kim, Nano Lett. 12 (2012) 1959.
[36] L. Lin, Q. Jing, Y. Zhang, Y. Hu, S. Wang, Y. Bando, R. P. Han, Z. L. Wang, Energy Environ. Sci. 6 (2013) 1164.
[37] J. Briscoe, M. Stewart, M. Vopson, M. Cain, P. M. Weaver, S. Dunn, Adv. Energy Mater. 2 (2012) 1261.
[38] K. Pradel, W. Wu, Y. Ding, Z. L. Wang, Nano Lett. (2014).
[39] Y. H. Kwon, D.-H. Kim, H.-K. Kim, J. Nah, Nano Energy 18 (2015) 126.
[40] K. C. Pradel, W. Wu, Y. Ding, Z. L. Wang, Nano Lett. 14 (2014) 6897.

What is claimed is:

1. A cascade-type compact hybrid cell comprising a laminate structure having the following elements: (a) a substrate; (b) an electrically insulating buffer layer; (c) a first electrode element; (d) a piezoelectric element configured to convert mechanic energy to electrical energy; and (e) a solar cell element configured to convert optical energy to electrical energy; and (f) a second electrode element; wherein the cascade-type compact hybrid cell further comprises an encapsulation element that encapsulates the laminate structure; wherein the piezoelectric element comprises an n-p homojunction ZnO piezoelectric nanogenerator element and wherein the solar cell element comprises an $n^+$-i-$p^+$ nanocrystal/amorphous Si:H thin-film.

2. The cascade-type compact hybrid cell defined in claim 1, wherein the substrate is a polymer.

3. The cascade-type compact hybrid cell defined in claim 1, wherein the substrate comprises a member selected from the group consisting of polyethylene naphthalate (PEN), aluminium and a silicon wafer.

4. The cascade-type compact hybrid cell defined in claim 1, wherein the buffer layer is a polymer.

5. The cascade-type compact hybrid cell defined in claim 1, wherein the buffer layer comprises a member selected from the group consisting of silicon nitride (SiN), silicon dioxide ($SiO_2$) and aluminum oxide.

6. The cascade-type compact hybrid cell defined in claim 1, wherein the first electrode comprises an optically-transparent first electrode.

7. The cascade-type compact hybrid cell defined in claim 1, wherein the first electrode comprises an aluminum-doped zinc oxide (AZO) layer, and/or an indium tin oxide (ITO) layer.

8. The cascade-type compact hybrid cell defined in claim 1, wherein the piezoelectric element further comprises an InN nanowire-based piezoelectric nanogenerator element.

9. The cascade-type compact hybrid cell defined in claim 1, wherein the hybrid cell further comprises a triboelectric element, wherein the triboelectric element comprises multiple layers of polymers.

10. The cascade-type compact hybrid cell defined in claim 1, wherein the hybrid cell further comprises a thermoelectric element, wherein the thermoelectric element comprises single or multiple layers of organic and/or inorganic materials.

11. The cascade-type compact hybrid cell defined in claim 1, wherein the second electrode comprises an optically-transparent second electrode.

12. The cascade-type compact hybrid cell defined in claim 1, wherein the second electrode comprises an aluminum-doped zinc oxide (AZO) layer, and/or the second electrode comprises an indium tin oxide (ITO) layer.

13. The cascade-type compact hybrid cell defined in claim 1, wherein the encapsulation element is a polymer.

14. The cascade-type compact hybrid cell defined in claim 1, wherein the encapsulation element comprises polydimethylsiloxane (PDMS).

15. The cascade-type compact hybrid cell defined in claim 1, wherein one or both of the buffer layer and the first electrode are deposited onto the substrate using a physical deposition method.

16. The cascade-type compact hybrid cell defined in claim 15, wherein the physical deposition method comprises radio-frequency (RF) magnetron sputtering at 150° C.

17. The cascade-type compact hybrid cell defined in claim 1, wherein the piezoelectric element is grown on the first electrode by a physical deposition method or by a chemical deposition method.

18. The cascade-type compact hybrid cell defined in claim 1, wherein the n-p homojunction ZnO piezoelectric nanogenerator element comprises ZnO homojunction nanowires that are grown using a hydrothermal method.

19. The cascade-type compact hybrid cell defined in claim 18, wherein the hydrothermal method comprises as follows: providing an aqueous solution for growing n-type ZnO nanowires, the aqueous solution comprising a mixture of zinc (Zn) nitrate hexahydrate (25 mM), hexamethylenetetramine (25 mM) and aluminum (Al) nitrate nonahydrate, wherein the atomic ratio of Al to (Al+Zn) in the mixture solution is controlled at 3 wt. %; adding a doping agent to the solution (heavily p-type); maintaining the aqueous solution at a substantially constant temperature of 88° C. during growth of the nanowires; controlling the length of the ZnO nanowire by growth time (about 500 nm/hour): one hour for the n-type section immediately followed by an additional half hour for the Li-doped p-type section.

20. The cascade-type compact hybrid cell defined in claim 1 wherein the thin-film layer, are deposited on top of the piezoelectric element by plasma-enhanced chemical-vapor deposition (PECVD).

21. The cascade-type compact hybrid cell defined in claim 1, wherein the piezoelectric element and the solar cell element can be integrated in series or in parallel to maximize the energy conversion efficiency of the hybrid cell.

22. The cascade-type compact hybrid cell defined in claim 9, wherein the hybrid cell further comprises a thermoelectric element, wherein the thermoelectric element comprises single or multiple layers of organic and/or inorganic materials.

* * * * *